United States Patent [19]
Wong et al.

[11] Patent Number: 5,715,145
[45] Date of Patent: Feb. 3, 1998

[54] ELECTRONIC CIRCUIT PACKS AND MOUNTING FRAMES

[75] Inventors: Eric H. Wong, Norcross; William K. Williams, Swanee, both of Ga.

[73] Assignee: Northern Telecom Limited, Montreal, Canada

[21] Appl. No.: 524,678

[22] Filed: Sep. 8, 1995

[51] Int. Cl.$^6$ .................................................. H05K 1/11
[52] U.S. Cl. .......................... 361/796; 361/802; 361/772; 361/785; 361/756; 361/803; 361/827; 439/61; 439/368
[58] Field of Search .................... 361/600, 614, 361/636, 640, 657, 679, 686, 725, 728, 729, 730, 733, 735, 736, 714, 718, 719, 826, 829, 803, 827, 828, 832, 823, 822; 439/61; 379/326, 329, 332, 397

[56] References Cited

U.S. PATENT DOCUMENTS 3,448,346  6/1969  Webb ............................. 317/122
4,124,878  11/1978 Ebner et al. ..................... 361/415
4,857,674  8/1989  Filbert .............................. 174/135
5,421,740  6/1995  Dittburner et al. ............... 439/376

FOREIGN PATENT DOCUMENTS 1-265599  10/1989  Japan ............................... 361/802

Primary Examiner—Leo P. Picard
Assistant Examiner—David Foster
Attorney, Agent, or Firm—Foley & Lardner

[57] ABSTRACT

An electronic circuit pack and mounting frame in which a cable directed to the circuit pack is received in a connector mounted upon a face of the pack or upon a face of a printed circuit board within the pack. Cables are mounted away from the front face of the pack and are directed from a cable receiving channel of a mounting frame to the connector with cable bends being permanently held by a surrounding molded encapsulation received within an access opening of the frame.

8 Claims, 3 Drawing Sheets

ELECTRONIC CIRCUIT PACKS AND MOUNTING FRAMES

This invention relates to electronic circuit packs and mounting frames.

Electronic circuit packs are known which are receivable into receiving stations in shelves of telecommunications or other electronic equipment. Throughout the specification and claims, the term "mounting frame" will be used as a general term to refer to a shelf when used singly or for an assembly of a plurality of shelves. Electronic circuit packs are normally connected by connectors at the rear of a mounting frame to back planes. At the front ends of the circuit packs, it is not uncommon for connectors also to be provided for connection by mating connectors, for instance to signal conductors extending to other circuit packs in the same frame or to other items of equipment exteriorly of the frame. Constructions of this type are described in U.S. Pat. No. 5,421,740 in the name of of R. C. Dittburner et al. An advantage of providing connector access at fronts of circuit packs is that it avoids the necessity of routing all circuitry, both signal and power, through the back planes and thus simplifies the back plane design and construction. Unfortunately, the arrangement of connectors at the front of a mounting frame is accompanied by location of cables down the front face of the frame itself. The cables and the front connectors are thus in a vulnerable position and cables extending across shelves may hamper the removal of individual circuit packs from their individual shelves.

In addition to this, it is sometimes necessary for cables being directed to circuit packs within their receiving stations to require a bend of small radius in order to move from one location to another and to avoid lack of control in the positioning of the cables. However, it is continually being found that cables do not readily accept their desired bent positions, because of their resilient nature, thereby resulting at the bend positions in cables uncontrollably directed so that they form obstructions to hinder access to other cables or equipment lying behind them.

The present invention seeks to provide a circuit pack, a mounting frame, a circuit pack and mounting frame combination, and a cable having a control bend and which will overcome or minimize the above disadvantages.

The present invention provides according to one aspect, a circuit pack having a front and a rear and comprising a printed circuit board extending in a plane between the front and the rear of the pack and having at least one cable connector mounted upon the printed circuit board and facing in a direction laterally outwardly from the plane of the printed circuit board.

With the circuit pack according to the invention defined above, a cable may be connected to the connector mounted on the printed circuit board without the cable passing along the front of a mounting frame, because the frontal mounting position for the connector itself is avoided. The cable may be directed therefore through a part of the mounting frame itself rearwardly of the front of the frame.

In preferred arrangements of the circuit pack, at least one cable guide element extends laterally of the pack for directing cable across the board surface as it extends to the connector. In addition, it is preferable for the connector to be disposed in a lower region of the printed circuit board and the guide element located rearwardly of and at a position above the connector, with the intention that the cable is to be fed outwardly from the connector and into the mounting frame at an upper region of the board.

The invention further includes a mounting frame for receiving a plurality of circuit packs, the frame having side-by-side receiving stations for acceptance of the circuit packs through a frontal opening of the frame, the frame also formed with a cable access opening for directing cable to each of the receiving stations, the cable access openings disposed at positions rearwardly of the front of the frame.

When the frame comprises a plurality of stacked shelves, the stacked shelves may be slightly spaced apart for cable access through the rear of the frame, the cables extending forwardly between the shelves to pass through the access openings to each receiving station. However, in preferred arrangements, a cable channel extends laterally across the receiving stations at a front end portion of the frame and this channel is preferably disposed above, but may be below, the receiving stations which it is to serve with individual access openings to each receiving station provided through the channel. In the preferred arrangement, however, the channel extends over the top of the receiving stations, the channel having a base which is itself formed with the individual access openings in a position rearwardly of the front of the frame. Thus, a plurality of cables may be positioned laterally of the frame in the channel with the cables directed through the access openings as required to selected receiving stations.

In addition, the invention also includes an electronic circuit pack and mounting frame combination comprising: a mounting frame for receiving a plurality of circuit packs, the frame having a plurality of side-by-side receiving stations for acceptance of circuit packs through a frontal opening of the frame, the frame also having a cable access opening to each receiving station, the cable access opening disposed at a position rearwardly of a front of the frame; a plurality of circuit packs each having a front and a rear and comprising a planar printed circuit board extending between the front and rear of the pack and having at least one cable connector mounted upon the printed circuit board and facing in a direction laterally outwards from the plane of the board; and a plurality of cables each to be passed through a selected cable access opening to a desired receiving station, each cable having a mating connector for the cable connector mounted upon the printed circuit board.

Each cable should normally require a bend portion to enable it to pass through its cable access to the desired receiving station. In order to control the bend radius of the bend portion, it is preferable to hold the bend portion permanently in bent condition by means of a molded encapsulation surrounding it, and the molded encapsulation is receivable within the associated cable access opening.

In a practical construction, in each circuit pack, it is a practical matter that the mating connector is connected to the connector on the printed circuit board before the circuit pack is inserted into position in its receiving station. Thus, it is necessary for the length of cable between the molded encapsulation and the mating connector to extend outwardly from the frame to enable such a connection to be made. It follows that upon insertion of the circuit pack into the receiving station, the length of cable from the encapsulation needs to be stored. For this purpose, it is desirable to locate the connector in a lower region of the printed circuit board and have at least one guide element extending from the printed circuit board for guiding the excess length of cable into a controlled and desired position around the printed circuit board with the circuit pack in its receiving station.

The invention further includes a telecommunications cable comprising a bend portion having a rigid molded encapsulation enclosing the bend portion to restrain it in a desired bent configuration.

According to yet a further aspect of the invention there is provided a method of providing a cable with a bend portion of desired bent configuration comprising disposing the cable with a part of its length, intermediate the cable ends, extending through and held within a mold, and with the part of the length held in the desired bent configuration to form the bend portion within the cavity; and molding a rigid encapsulation within the cavity, the encapsulation surrounding the bend portion to restrain it in the desired bent configuration.

One embodiment of the invention will now be described, by way of example, with reference to the accompanying drawings, in which.

Figure 1:
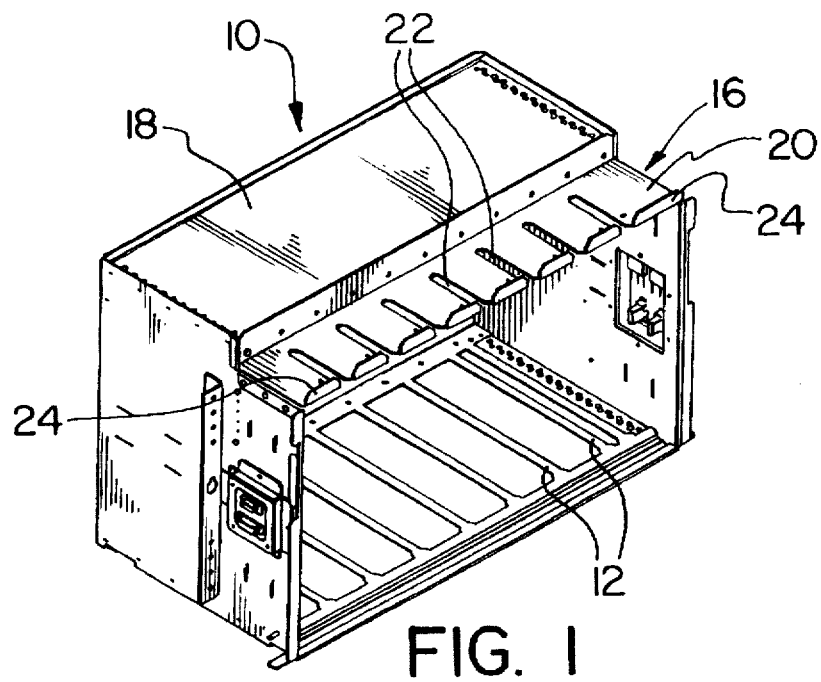
FIG. 1 is an isometric view of a shelf of a mounting frame for holding circuit packs.
Figure 2:
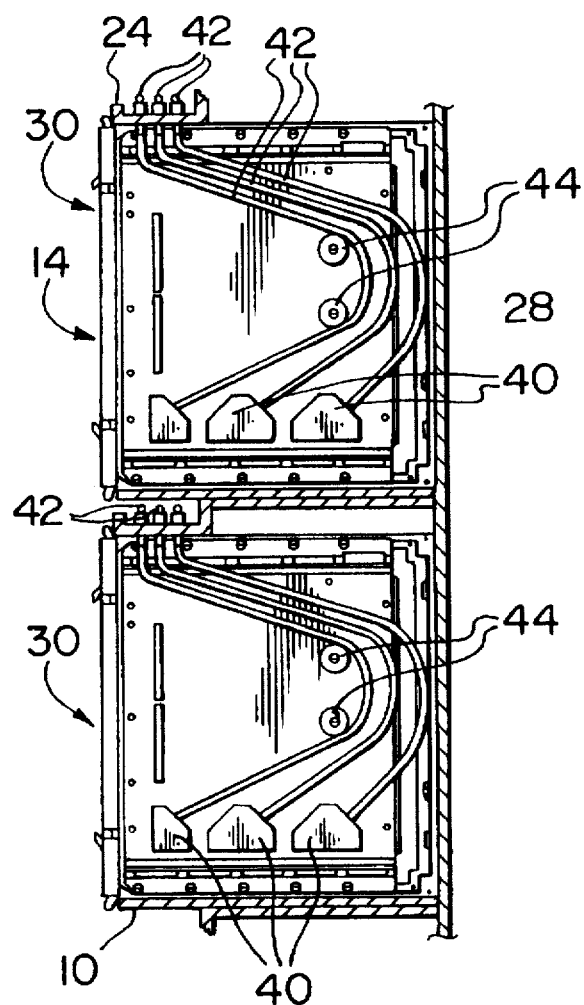
FIG. 2 is a cross-sectional view taken along line II—II in FIG. 1 and showing the shelf in stacked formation together with similar shelves in the mounting frame.

As shown by FIG. 1, in the embodiment, a shelf 10 for accepting a plurality of side-by-side circuit packs within receiving stations 12, forms part of a mounting frame 14 (as shown in FIG. 2) in a stack with other identical shelves 10. The shelf 10 is basically of similar design to conventional shelves, but is provided at a front of the shelf with a cable channel 16 provided by a downward step from a top 18 of the circuit pack, the cable channel 16 having a base 20 extending laterally of the shelf from side-to-side and across the receiving stations 12. The cable channel is interconnected with each of the receiving stations 12 by means of a cable access opening in the form of a slot 22 which is disposed above each station 12. Each slot 22 extends rearwardly from a slot opening at the front of the frame as shown by FIG. 1. Between adjacent slots 22 and outwardly from end slots 22 are positioned upward flanges 24 for holding cables extending across the channel in position. As shown by FIG. 2, each of the channels 16 below the top shelf 10 is surmounted by a bottom 26 of the shelf immediately above it.

Figure 3:
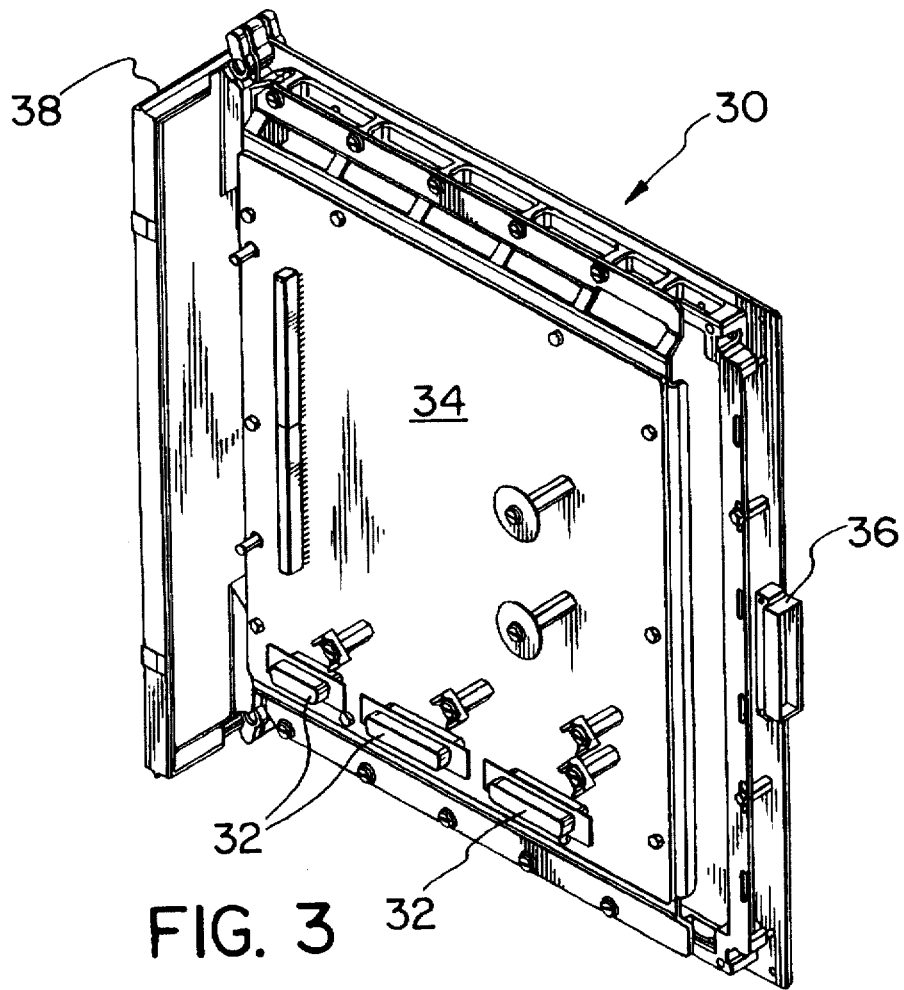
FIG. 3 is an isometric view taken from the rear of a circuit pack according to the embodiment.
Figure 4:
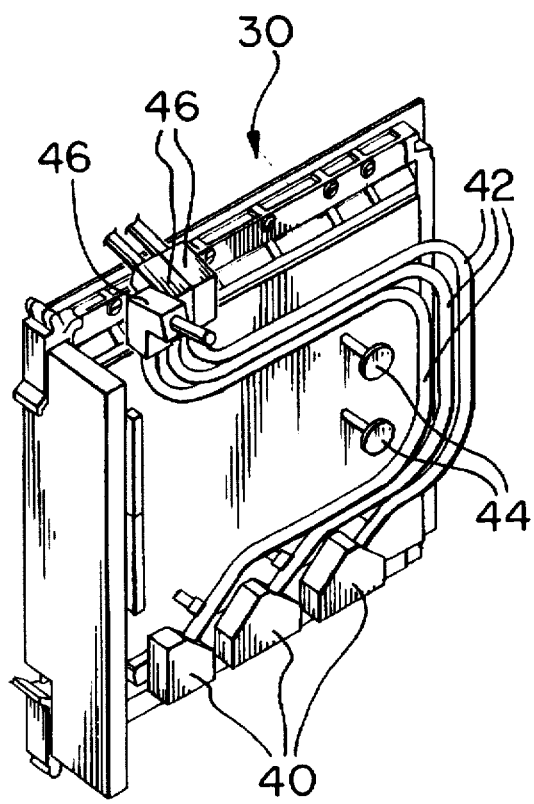
FIG. 4 is an isometric view taken from the front of the circuit pack and showing cables extending to connectors of the pack.

It is the intention for the back plane or back planes 28 (FIG. 2) at the rear of the mounting frame not to be used to provide all of the signal and power facilities to the circuit packs while the use of connectors at the fronts of the circuit packs accompanied by frontal disposition of cables is avoided. This requirement is provided in the embodiment, as in the invention generally, by providing each circuit pack 30 (FIGS. 3 and 4) with at least one connector 32 (namely three in the embodiment) which is mounted upon a major side surface of the printed circuit board 34 of the circuit pack and is directed laterally outwards from the plane of the board. These connectors are for acceptance of data processing signals. A further connector 36 extends rearwardly of the circuit pack for connection to a corresponding connector (not shown) on an associated back plane 28. As shown by FIGS. 3 and 4, the circuit pack 30 has a width indicated by a frontal plate 38 such that connectors 40 (FIG. 4) at ends of signal cables 42 may be accommodated within the width of the circuit pack while being connected to the connectors 32.

For reasons to be described below, the connectors 32 are disposed in a horizontally spaced position along a lower region of the printed circuit board, i.e. spaced substantially from the guide channel 16 along which the cables 42 are to be located. Cable guide elements 44 extend outwardly from the printed circuit board 34 towards the rear of the board, one guide element 44 above another, with both elements 44 at positions higher than the connectors 32. As may be seen from FIGS. 2 and 4, the connectors 40 are of such a shape that, when connected to the connectors 32, the cables 42 extend rearwardly from the connectors 40 so as to pass around the guide elements 44 before extending forwardly to enable them to pass through the cable access slots 22 and into the guide channel 16.

The cables 42 are each bent at a extremely small desired radius for them to change in direction suddenly as they move from the channel 16 into associated cable access slots 22. The depth of each of the channels 16 is necessarily shallow vertically and it is undesirable to allow the cables to be uncontrolled at the bent positions within the channel, because this would result in haphazard and randomness in directing of the cables in the channel thereby limiting access for cable insertion and future access to inserted cables. With this thought in mind, the embodiment includes a rigid molded encapsulation 46 (see FIGS. 4, 6 and 7) which surrounds a bend portion of each cable so as to hold the bend portion permanently in a bent condition with a desired small radius of bend. Thus the bend portion of each cable cannot attempt to resiliently return towards an unbent condition. The angle of bend of each bend portion held by its individual encapsulation 46 is approximately 102° although other small angles of bend may instead be desirable. Also, the radius of bend is extremely small. The radius of bend taken together with the bend angle is sufficient to hold the cable substantially towards the base 20 of its respective channel 16 so as to provide space for other cables which may be positioned alongside it or perhaps even to overlie it within the channel. As may be seen from FIG. 7, each encapsulation 46 slides along a respective access slot 22 with the sides of the slot lying within a recess 48 of the encapsulation to hold the encapsulation in position until removed by movement forwardly from the slot.

Figure 5:
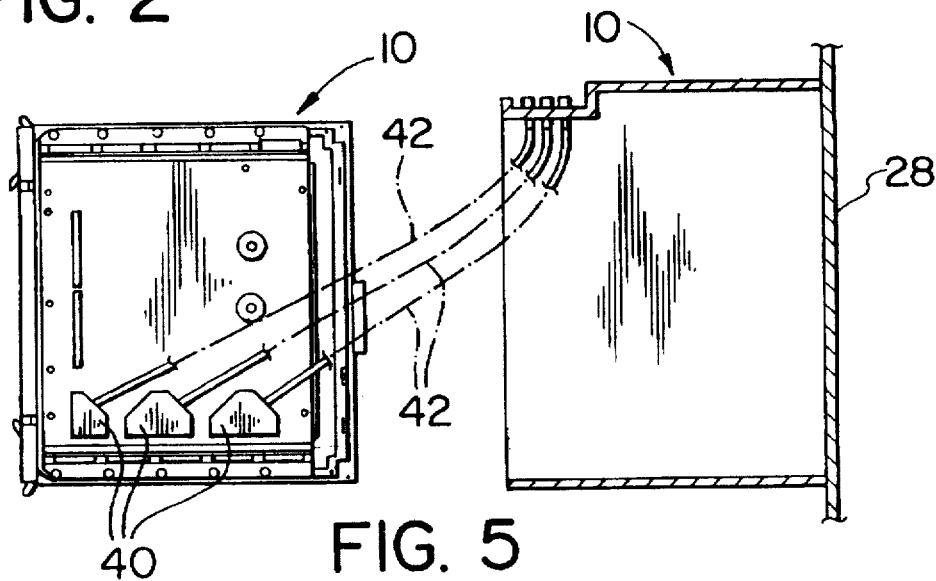
FIG. 5 is a view similar to FIG. 2 and showing the position of a circuit pack at one stage during insertion of the pack into an associated shelf.
Figure 6:
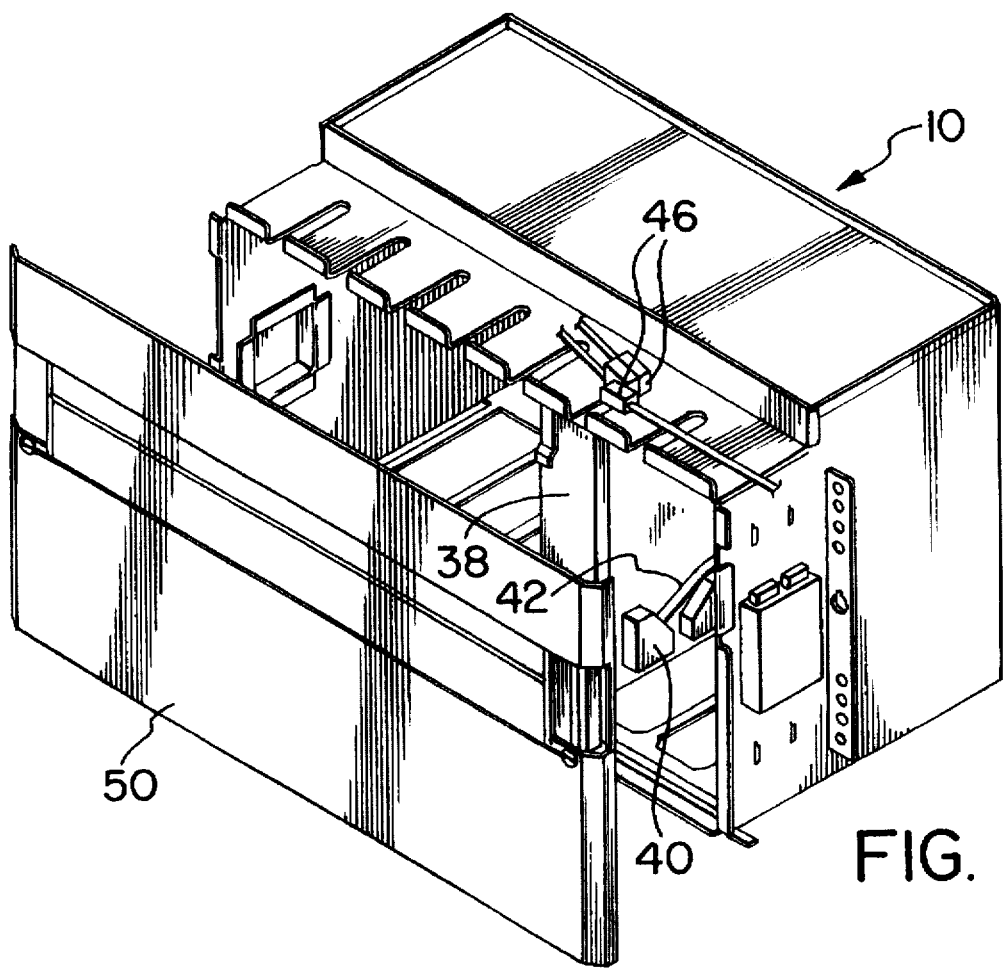
FIG. 6 is a front elevational view of the shelf of FIG. 1 and showing one of a plurality of circuit packs in the shelf and accompanied by a front cover for the shelf.
Figure 7:
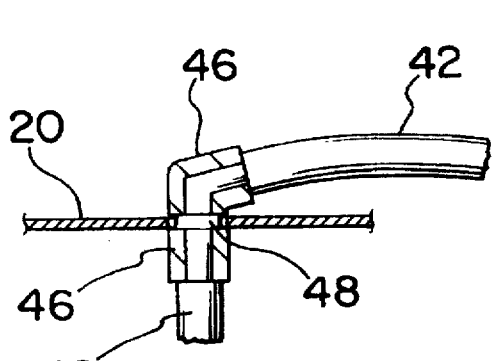
FIG. 7 is an isometric view of a rigid molded encapsulation around a bend portion of cable extending to a circuit pack as shown in the above drawings.

As may be seen from the above description, and as shown particularly in FIG. 6, each of the cables 42 extends in an appropriate direction along its respective channel 16 to pass through an associated access slot 22 within an individual encapsulation 46 which holds the cable at its bend portion in the appropriate manner for cable position control. To insert a circuit pack into an appropriate shelf, the circuit pack is held manually forwardly of the shelf as shown in FIG. 5. Each of the associated cables extending from the slot 22 for the appropriate receiving station are then extended forwardly from the shelf so that the connectors 40 may be interconnected with the connectors 32 of the circuit pack. As may be seen from FIG. 5, the lengths of the cables 42 extending from the molded encapsulations 46, need to be substantial for this connection to be made. With the cables extending from the connectors 40 and beneath the guide elements 44, and with the encapsulations 46 already retained within the associated slot 22, the circuit pack 10 is then inserted into its shelf, through a frontal opening, and into a use position in its receiving station as shown in FIG. 2. During this movement, the lengths of cable 42 extending from the encapsulations 46 to the connectors 40 are caused to pass around the guide elements 44 so as to assume the stowed cable positions shown in FIG. 4 in which they lie within the width of the circuit pack as dictated by the front plate 38. Thus, an assembly results in which while all of the power and signal facilities RE not provided upon the back planes 28, nevertheless, no connectors and cables are visible at the front of the mounting frame. In contrast, the cables are restrained within the cable channels 16 with the connectors carried upon the circuit board and within the shelves. Consequently, front closure panels 50 (FIG. 6) may be added to the fronts of the shelves to present a clean and tidy appearance with all vulnerable operating parts and cable being protected.

Figure 8:
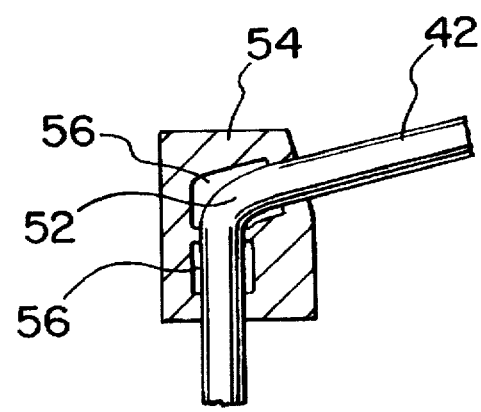
FIG. 8 shows part of the process for manufacturing the encapsulation of FIG. 7.

Each of the encapsulations 46 is molded around the bend portion 52 of each cable 42 by inserting the cable into a suitable mold 54 (FIG. 8) while at the same time forming the bend portion 52 and holding it in position upon mold closure. The mold is, of course, disposed at an appropriate spacing from the associated connector 40 of the cable to enable the routing of the cable around the board when in the use position shown in FIGS. 2 and 4. The encapsulation 46 is then molded from a suitable plastics material within the cavity 56 of the mold, and upon cooling the mold is opened and the cable bend portion surrounded by the encapsulation is removed for service. It has been found that, although the cable may be bent at an extremely small radius and to an angle of 102° or to any other suitable angle, nevertheless, the encapsulation 46 is capable of restraining the bend portion in its bent position to serve the purpose of directing the cable through an access slot 22 as described in the embodiment. Signal cables which have been bent in this manner and restrained by encapsulations 46 have included cables having a cable diameter of around 0.460 inches. No encapsulation failure has been found with cables of such a diameter and having up to eight pairs of conductors.

What is claimed is:

1. A circuit pack having a front and a rear, comprising:

a printed circuit board having two major side surfaces, the printed circuit board extending in a plane between the front and the rear of the pack; and at least one cable connector mounted upon one major side surface of the printed circuit board, the at least one cable connector extending outwardly from the one major side surface at an angle to the plane of the printed circuit board; and the printed circuit board being provided with at least one guide element projecting outwards from the one major side surface at an angle to the plane of the printed circuit board for guiding cable extending across the circuit board to the connector.

2. A circuit pack according to claim 1 wherein the connector is disposed in a lower region of the printed circuit board and the guide element is located rearwardly of and at a position above the connector.

3. A mounting frame for receiving a plurality of circuit packs, the frame comprising:

a frontal opening of the mounting frame;

side-by-side receiving stations for acceptance of the circuit packs through the frontal opening of the frame; and cable access openings for directing cable to each of the receiving stations respectively, the cable access openings being disposed at positions rearwardly of the frontal opening of the mounting frame.

4. An electronic circuit pack and mounting frame assembly comprising:

a mounting frame having a plurality of side-by-side receiving stations for horizontal acceptance of circuit packs through a frontal opening of the frame, the frame also having a plurality of cable access openings associated with each receiving station respectively, the cable access openings being disposed at a position rearwardly of a front of the frame;

a plurality of circuit packs each having a front and a rear and comprising a planar printed circuit board having two major side surfaces, the printed circuit board extending between the front and the rear of the pack and having at least one cable connector mounted on one major side surface of the printed circuit board and extending outwardly from the one major side surface at an angle to the plane of the printed circuit board, each of the circuit packs being mounted within a respective one of the receiving stations; and a plurality of cables, each cable extending through a selected cable access opening between adjacent circuit packs and across the one major side surface of a corresponding printed circuit board, each cable having a mating connector connected to the at least one cable connector mounted upon the corresponding printed circuit board.

5. An assembly according to claim 4 wherein each cable is formed with a bend portion to enable each cable to be directed through the selected cable access opening, the assembly further comprising a molded encapsulation surrounding the bend portion, the molded encapsulation being receivable within the selected cable access opening and permanently holding the bend portion in a bent condition.

6. An assembly according to claim 5 wherein each cable access opening is formed as a slot extending rearwardly of the frame into the channel, the slot opening at the front of a frame.

7. An assembly according to claim 5 further comprising at least one guide element extending laterally of each circuit pack for directing a respective cable of the plurality of cables extending across the printed circuit board to the connector.

8. An assembly according to claim 7 wherein the at least one cable connector on the printed circuit board is disposed in a lower region of the printed circuit board and the at least one guide element is located rearwardly of and a at position above the at least one cable connector whereby, with the circuit pack disposed forwardly of the frame, the cable is of sufficient length to connect the mating connector with the at least one cable connector on the printed circuit board, the circuit pack then being insertable into the frontal opening of the frame and movable into the respective one of the receiving stations while the cable is guided from the mating connector in a desired path around the at least one guide element and to the molded encapsulation.

* * * * *